US009269830B2

(12) United States Patent
Matsunaga et al.

(10) Patent No.: US 9,269,830 B2
(45) Date of Patent: Feb. 23, 2016

(54) JUNCTION FIELD EFFECT TRANSISTOR AND ANALOG CIRCUIT

(71) Applicant: PANASONIC CORPORATION, Osaka (JP)

(72) Inventors: Tomohiro Matsunaga, Toyama (JP); Tsuneichiro Sano, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 158 days.

(21) Appl. No.: 13/659,386

(22) Filed: Oct. 24, 2012

(65) Prior Publication Data

US 2013/0056801 A1    Mar. 7, 2013

Related U.S. Application Data

(63) Continuation of application No. PCT/JP2011/001814, filed on Mar. 28, 2011.

(30) Foreign Application Priority Data

May 17, 2010    (JP) .................................. 2010-113706

(51) Int. Cl.
*H01L 29/808*    (2006.01)
*H01L 29/06*    (2006.01)
(Continued)

(52) U.S. Cl.
CPC .......... *H01L 29/808* (2013.01); *H01L 29/0696* (2013.01); *H01L 29/66901* (2013.01); *H03F 3/1935* (2013.01); *H03F 3/45381* (2013.01); *H03F 3/50* (2013.01)

(58) Field of Classification Search
CPC .................................................. H01L 29/0869
USPC .......... 257/272, 256, E29.312, E27.069, E29, 257/226, E29.31, E27.046, E27.059, 287, 257/E29.226; 438/186, 188, 194
See application file for complete search history.

(56) References Cited

U.S. PATENT DOCUMENTS 3,896,483 A   *   7/1975  Whelan .......................... 257/403
4,485,392 A   *   11/1984 Singer ............................ 257/272
(Continued)

FOREIGN PATENT DOCUMENTS

JP    S52-44577    *   4/1977    .............. H01L 29/80
JP    S55-88378    *   7/1980    .............. H01L 29/80
(Continued)

OTHER PUBLICATIONS

Translation, Ono, Japanese Pat. Pub. No. H4-162635, translation date: Feb. 2014, FLS, Inc., all pages.*
(Continued)

*Primary Examiner* — Victoria K Hall
(74) *Attorney, Agent, or Firm* — McDermott Will & Emery LLP

(57) ABSTRACT

A junction field effect transistor comprising: a semiconductor substrate having a first conductivity type; a channel region having a second conductivity type different from the first conductivity type, and being formed in a surface of the semiconductor substrate; a first buried region having the second conductivity type, being formed within the channel region, and having an impurity concentration higher than the channel region; a first gate region having the first conductivity type, and being formed in a surface of the channel region; and first drain/source region and a second drain/source region both having the second conductivity type, which are formed each on an opposite side of the first gate region in the surface of the channel region, in which the first buried region is not formed below the second drain/source region, but is formed below the first drain/source region.

8 Claims, 14 Drawing Sheets

(51) Int. Cl.
*H01L 29/66* (2006.01)
*H03F 3/193* (2006.01)
*H03F 3/45* (2006.01)
*H03F 3/50* (2006.01)

(56) References Cited

U.S. PATENT DOCUMENTS

| | | | | |
|---|---|---|---|---|
| 4,494,134 | A | * | 1/1985 | Wildi et al. ............ 257/273 |
| 4,777,451 | A | * | 10/1988 | Tohyama ............... 330/253 |
| 5,414,387 | A | * | 5/1995 | Nakahara et al. ......... 330/54 |
| 5,990,737 | A | * | 11/1999 | Czarnul et al. .......... 330/69 |
| 6,809,591 | B1 | * | 10/2004 | Ohashi ................ 330/279 |
| 7,944,017 | B2 | | 5/2011 | Hatamoto et al. |
| 7,994,535 | B2 | | 8/2011 | Gunji et al. |
| 2004/0238840 | A1 | | 12/2004 | Gunji et al. |
| 2007/0227240 | A1 | * | 10/2007 | Kawase et al. ......... 73/146.5 |
| 2008/0014687 | A1 | * | 1/2008 | Vora et al. ............ 438/186 |
| 2009/0039398 | A1 | | 2/2009 | Hatamoto et al. |
| 2010/0315128 | A1 | * | 12/2010 | Kapoor ................ 326/112 |

FOREIGN PATENT DOCUMENTS

| | | | | |
|---|---|---|---|---|
| JP | 58-116776 | A | | 7/1983 |
| JP | S59-65486 | | * | 4/1984 ............ H01L 29/80 |
| JP | 61-100975 | A | | 5/1986 |
| JP | 01-268068 | A | | 10/1989 |
| JP | 03-125472 | A | | 5/1991 |
| JP | 04-162635 | A | | 6/1992 |
| JP | 2002-190480 | A | | 7/2002 |
| JP | 2004-356534 | A | | 12/2004 |
| JP | 2006-108232 | A | | 4/2006 |
| JP | 2007-005767 | A | | 1/2007 |
| JP | 2009-043923 | A | | 2/2009 |

OTHER PUBLICATIONS

Kwok K. Ng, Complete Guide to Semiconductor Devices, 2002, John Wiley & Sons, Inc., 2d. ed., pp. 656-659.*
Machine translation, Sakamoto, Japanese Patent Pub. No. 2002-190480 (translation date: Mar. 12, 2015), JPO & Japio, all pages.*
Machine translation, Hatamoto, Japanese Patent Pub. No. 2009-043923 (translation date: Mar. 12, 2015), JPO & Japio, all pages.*
Machine translation, Japan Patent Office, Notification for Reasons of Refusal, Application No. 2010-113706, Jun. 24, 2014 (translation date: Mar. 12, 2015), JPO & Japio, all pages.*
Machine translation, Abstract, Ishitani, Japanese Pat. Pub. No. S52-44577, translation date: Jun. 1, 2015, Espacenet, all pages.*
Translation, Ishitani, Japanese Pat. Pub. No. S52-44577, translation date: Jun. 2015; FLS, Inc., all pages.*
Translation, Inomata, Japanese Pat. Pub. No. S55-88378, translation date: Jun. 2015 (error in document says translation date is June 2105); Phoenix Translation, all pages.*
Translation, Kishimoto, Japanese Pat. Pub. No. S59-65486, translation date: Jun. 2015; FLS, Inc., all pages.*
Kwok K. Ng, Complete Guide to Semiconductor Devices, John Wiley & Sons (ed. ed. 2002), Appendix C-3, all pages.*
Japanese Office Action issued in corresponding Japanese Application No. 2010-113706, dated Jul. 1, 2014.
International Search Report mailed Jun. 21, 2011 issued in corresponding International Application No. PCT/JP2011/001814.

* cited by examiner

JUNCTION FIELD EFFECT TRANSISTOR AND ANALOG CIRCUIT

CROSS REFERENCE TO RELATED APPLICATION

This is a continuation application of PCT Patent Application No. PCT/JP2011/001814 filed on Mar. 28, 2011, designating the United States of America, which is based on and claims priority of Japanese Patent Application No. 2010-113706 filed on May 17, 2010. The entire disclosures of the above-identified applications, including the specifications, drawings and claims are incorporated herein by reference in their entirety.

FIELD

The present invention relates to a junction field effect transistor, a manufacturing method thereof, and an analog circuit.

BACKGROUND

A junction field effect transistor (JFET) is an effective device for noise resistance property, and is thus used in a low-noise circuit. Thus, the JFET has an advantage in being jointly mounted with a logic circuit which generates the noise.

FIGS. 20 and 21 are diagrams each of which shows configuration of a conventional JFET. FIGS. 20 and 21 show a JFET 100 in which an n-type buried region 104 is formed on a p-type silicon semiconductor substrate 101, and over the n-type buried region 104, an n-type layer of a channel region 103 separated by a p-type separation region 105 is provided. Furthermore, an n-type source region 107 and an n-type drain region 108 are provided in the channel region 103, and a p-type gate region 106 is formed between the n-type source region 107 and the n-type drain region 108.

The n-type source region 107, the n-type drain region 108, and the p-type gate region 106 are arranged in stripes in a plane pattern.

On the n-type source region 107 and the n-type drain region 108, a source electrode 121 and a drain electrode 122 are respectively provided which are respectively connected to the n-type source region 107 and the n-type drain region 108. A gate electrode 120 is mounted on a rear surface, of the semiconductor substrate 101, which serves as a backgating region.

CITATION LIST

Patent Literature

[PTL 1] Japanese unexamined patent application publication No. 2009-43923

SUMMARY

Technical Problem

In the conventional JFET, however, the n-type buried region is formed in an entire bottom surface of the channel region, causing resistance of a lower part of the channel region to be low. Accordingly, the conventional JFET has been susceptible to an external noise which occurs in a logic circuit. This imposes a substantial restriction on layout design for configuring a circuit in the semiconductor substrate. Alternatively, if an analog circuit is surrounded by multiple well layers to cope with the external noise, the size of a chip unfortunately increases.

In view of the above, an object of the present invention is to provide the JFET and the analog circuit which are capable of reducing an influence of the external noise.

Solution to Problem

In order to achieve the aforementioned object, a junction field effect transistor according to an aspect of the present invention includes: a semiconductor substrate having a first conductivity type; a channel region having a second conductivity type different from the first conductivity type, and being formed in a surface of the semiconductor substrate; a first buried region having the second conductivity type, being formed within the channel region, and having an impurity concentration higher than the channel region; a first gate region having the first conductivity type, and being formed in a surface of the channel region; and a first drain/source region and a second drain/source region both having the second conductivity type, which are formed each on an opposite side of the first gate region in the surface of the channel region, in which the first buried region is not formed below the second drain/source region, but is formed below the first drain/source region.

With this configuration, in the junction field effect transistor according to an aspect of the present invention, no buried region is formed below the second drain/source region. Accordingly, an area below the second drain/source region has high resistance with respect to the semiconductor substrate. Accordingly, the second drain/source region is less affected by an external noise. In addition, the buried region is formed below the first drain/source region, to thereby reduce on-resistance of the junction field effect transistor.

When the junction field effect transistor is used for an analog circuit, noise resistance properties required for respective source and drain terminals of the junction field effect transistor are different from each other, depending on a circuit configuration of the analog circuit. Accordingly, the buried region is formed below the terminal (first drain/source region) for which the high noise resistance property is not required, while the buried region is not formed below the terminal (second drain/source region) for which the high noise resistance property is required, thereby achieving reduction of the on-resistance and also efficiently suppressing reduction in the noise resistance property of the junction field effect transistor.

The first buried region may not be formed below the first gate region.

With this configuration, the junction field effect transistor according to an aspect of the present invention can lower a pinch-off voltage.

The junction field effect transistor may further include: a second gate region formed in the surface of the channel region so that the second drain/source region is located between the second gate region and the first gate region; a third drain/source region formed in the surface of the channel region so that the second gate region is located between the third drain/source region and the second drain/source region; a first line electrically connecting the first gate region to the second gate region; a second line electrically connecting the first drain/source region to the third drain/source region; and a second buried region having the second conductivity type, being formed below the third drain/source region within the channel region, and having the impurity concentration higher than the channel region.

With this configuration, in the junction field effect transistor according to an aspect of the present invention, the second drain/source region is arranged at a center part of an area where the junction field effect transistor is formed. This further improves the noise resistance property of the second drain/source region.

The first gate region may surround the second drain/source region, and the first drain/source region may surround the first gate region.

With this configuration, in the junction field effect transistor according to an aspect of the present invention, the second drain/source region is arranged at a center part of an area where the junction field effect transistor is formed. With this configuration, the noise resistance property of the second drain/source region can be further improved.

An analog circuit according to an aspect of the present invention includes: a first junction field effect transistor which is the junction field effect transistor; an output terminal; a power-supply terminal; and a ground potential terminal, in which the first junction field effect transistor has the first drain/source region connected to a side of the power-supply terminal or a side of the ground potential terminal, and the first junction field effect transistor has the second drain/source region connected to a side of the output terminal.

With this configuration, the analog circuit according to an aspect of the present invention can improve the noise resistance property of the side of the output terminal (second drain/source region) which is susceptible to the influence of a noise. The buried region is formed below the first drain/source region connected to a side of the power-supply terminal or the ground potential terminal both of which are insusceptible to the influence of the noise, thereby increasing an on-state current. As described above, the analog circuit according to an aspect of the present invention can reduce the on resistance and also suppress the reduction of the noise resistance property.

The first junction field effect transistor may have the second drain/source region connected to the output terminal.

With this configuration, the analog circuit according to an aspect of the present invention can improve the noise resistance property of the output terminal (second drain/source region) which is susceptible to the influence of noise. Accordingly, the analog circuit according to an aspect of the present invention can reduce the on resistance and also efficiently suppress the reduction in the noise resistance property.

The first junction field effect transistor may have the first drain/source region connected to the power-supply terminal or the ground potential terminal.

With this configuration, the analog circuit according to an aspect of the present invention can suppress the reduction in the noise resistance property and reduce the on resistance by forming the buried region below the first drain/source region which is insusceptible to the influence of the noise.

The analog circuit may be a source-grounded amplifier circuit which has an input terminal, and the first junction field effect transistor may have the first gate region connected to the input terminal.

With this configuration, the analog circuit according to an aspect of the present invention can achieve the source-grounded amplifier circuit which is insusceptible to the influence of the noise.

The analog circuit may be a source follower circuit which has an input terminal, and the first junction field effect transistor may have the first gate region connected to the input terminal.

With this configuration, the analog circuit according to an aspect of the present invention can achieve the source follower circuit which is insusceptible to the influence of the noise.

The analog circuit may be a differential amplifier circuit which has two differential input terminals: the analog circuit may include a second junction field effect transistor which is the junction field effect transistor: the first and second junction field effect transistors may serve as a differential pair: the first junction field effect transistor may have the first gate region connected to one of the differential input terminals: and the second junction field effect transistor may have the first gate region connected to the other of the differential input terminals.

With this configuration, the analog circuit according to an aspect of the present invention can achieve the differential amplifier circuit which is insusceptible to the influence of the noise.

It should be noted that the present invention can be achieved as the aforementioned junction field effect transistor and the analog circuit, and may also be achieved as a manufacturing method for a junction field effect transistor, or a manufacturing method for an analog circuit, for respectively manufacturing the aforementioned junction field effect transistor and analog circuit.

Furthermore, the present invention can be achieved as the aforementioned field effect transistor or a semiconductor integrated circuit (LSI) including the aforementioned analog circuit.

Advantageous Effects

As described above, the present invention can provide a JFET which can reduce an influence of a noise.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Hereinafter, embodiments of a JFET according to the present invention are described in detail with reference to drawings. It should be noted that since structural components allocated by the same references operate in a similar way, description on such a structural component is omitted in some cases.

Embodiment 1

In a JFET 50 according to Embodiment 1 of the present invention, a buried region is formed below one of a source region and a drain region. With this configuration, an influence of an external noise can be reduced in the JFET 50 according to Embodiment 1 of the present invention.

Figure 1:
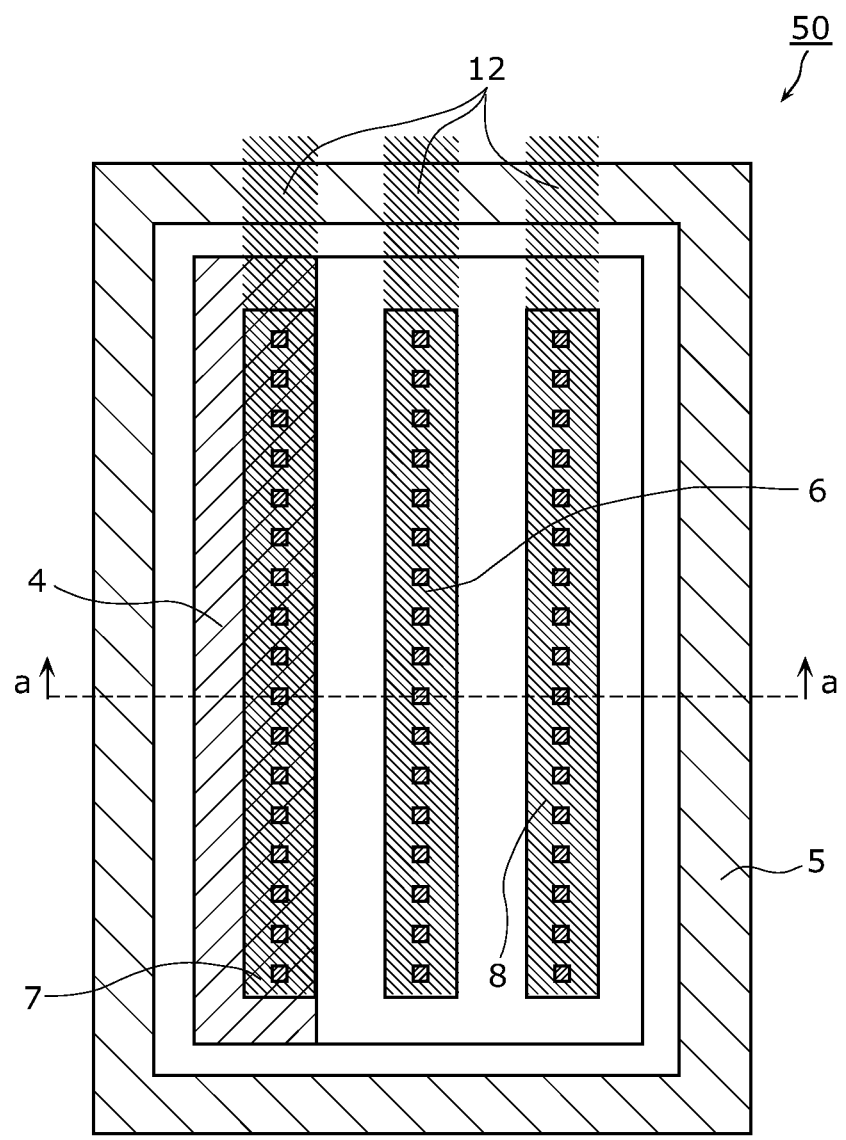
FIG. 1 is a plan view which shows a JFET according to Embodiment 1 of the present invention.
Figure 2:
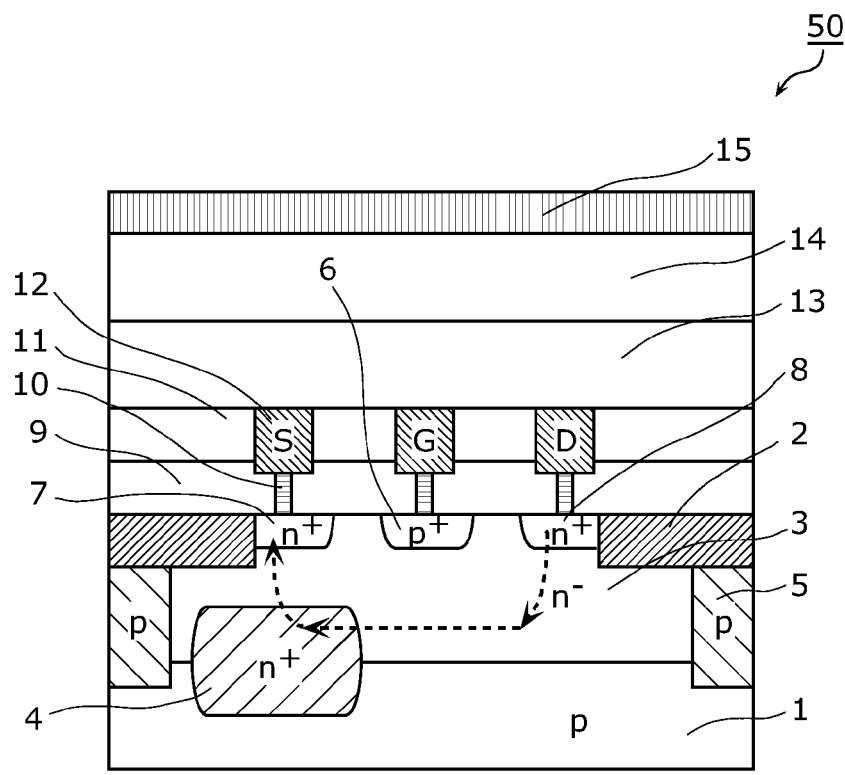
FIG. 2 is a cross sectional view which shows the JFET according to Embodiment 1 of the present invention.

FIG. 1 is a plan view which shows the JFET 50 according to Embodiment 1 of the present invention. FIG. 2 is a cross sectional view taken along a line a-a in FIG. 1.

The JFET 50 according to Embodiment 1 of the present invention includes a p-type semiconductor substrate 1, an n-type channel region 3, a p-type gate region 6, n-type drain/source regions 7 and 8, and an n-type buried region 4. The p-type gate region 6, the n-type drain/source regions 7 and 8 are provided in a surface of the n-type channel region 3.

The p-type semiconductor substrate 1 is a p-type silicon semiconductor substrate (an impurity concentration is at a level of $4E15\ cm^{-3}$).

The n-type channel region 3 is an n-type layer formed, on a surface of the p-type semiconductor substrate 1, by performing ion-implant and diffusion on an n-type impurity, and has the impurity concentration at a level of $2.0E12\ cm^{-3}$. The n-type channel region 3 is separated in an island shape by a separation region 5 which reaches the p-type semiconductor substrate 1, so as to be specified as the n-type channel region 3.

The p-type gate region 6 is formed by implanting a p-type impurity in the surface of the n-type channel region 3, and has the impurity concentration at a level of $4E15\ cm^{-3}$.

Each of the n-type drain/source regions 7 and 8 is formed by implanting the n-type impurity on the surface of the n-type channel region 3. The n-type drain/source region 7 and the n-type drain/source region 8 are arranged in respective sides of the p-type gate region 6, to sandwich, therebetween, the p-type gate region 6. One of the n-type drain/source regions 7 and 8 serves as a source region of the JFET 50, while the other one serves as a drain region of the JFET 50. It should be noted that, in FIG. 2, the drain/source region 7 serves as the source region, while the drain/source region 8 serves as the drain region.

The n-type buried region 4 is formed in the n-type channel region 3, and has the impurity concentration higher than the n-type channel region 3 has. The n-type buried region 4 is a layer arranged immediately below the n-type drain/source region 7 by ion-implanting and diffusing the n-type impurity, and has the impurity concentration at a level of $3E12\ cm^{-3}$. If the separation region 5 and the n-type buried region 4 come into contact with each other, a breakdown voltage decreases. In view of this, a distance at a level of 2 to 3 μm is provided between the separation region 5 and the n-type buried region 4.

In addition, the n-type buried region 4 is formed only below the n-type drain/source region 7, but is not formed below the n-type drain/source region 8 or the p-type gate region 6.

As described above, in the JFET 50 according to Embodiment 1 of the present invention, the n-type buried region 4 is not formed below the n-type drain/source region 8. With this configuration, a noise resistance property of the n-type drain/source region 8 can be improved. The n-type buried region 4 is formed below the n-type drain/source region 7. Accordingly, on-resistance of the JFET 50 can be reduced.

Here, a semiconductor integrated circuit 200 is described which employs the JFET 50 according to Embodiment 1 of the present invention.

Figure 3:
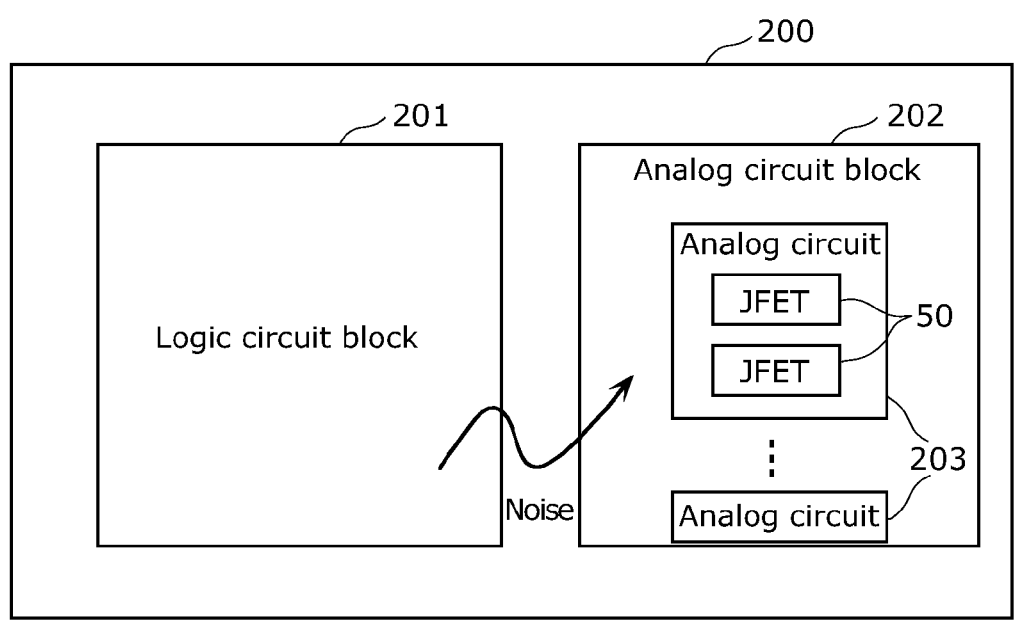
FIG. 3 is a block diagram which shows a semiconductor integrated circuit according to Embodiment 1 of the present invention.

FIG. 3 is a block diagram which shows the semiconductor integrated circuit 200 according to Embodiment 1 of the present invention. The semiconductor integrated circuit 200 shown in FIG. 3 includes a logic circuit block 201 and an analog circuit block 202 which are formed on the same semiconductor substrate 1. The analog circuit block 202 includes a plurality of analog circuits 203. Each of the analog circuits 203 includes the aforementioned JFET 50.

As shown in FIG. 3, a noise which occurs in the logic circuit block 201 enters, through the semiconductor substrate 1, the analog circuit block 202 including the JFET 50. In the JFET 50, the n-type buried region 4 is not formed below the n-type drain/source region 8. Accordingly, an area below the n-type drain/source region 8 has high resistance with respect to the semiconductor substrate 1. This reduces the influence of the external noise in the n-type drain/source region 8.

If the JFET 50 is used in the analog circuit 203, a noise resistance property required for the source terminal (n-type drain/source region 7) of the JFET 50 and a noise resistance property required for the drain terminal (n-type drain/source region 8) of the JFET 50 are different from each other, depending on a circuit configuration of the analog circuit 203. Consideration is given to a case where, for example, the source terminal of the JFET 50 is connected to a power-supply line or a ground potential line, and the drain terminal is connected to an output terminal of the analog circuit 203. In this case, since a fixed power-supply voltage or ground potential is supplied to the source terminal, the source terminal is insusceptible to the influence of the noise. However, the drain terminal (the output terminal of the analog circuit 203) is susceptible to the influence of the noise. In addition, if the drain terminal is affected by the noise, the influence substantially affects on a property of the analog circuit 203. In other words, high noise resistance property is not required for the source terminal, whereas the high noise resistance property is required for the drain terminal in this case.

Meanwhile, comparison between a case with the n-type buried region 4 and a case without the n-type buried region 4 shows an advantage that the on-resistance of the JFET 50 can be reduced in the case with the n-type buried region 4. If the n-type buried region 4 is formed in an entire region of the n-type channel region 3, the on-resistance of the JFET 50 decreases. However, the noise resistance property also decreases.

As described above, improvement of the noise resistance property and decrease in the on-resistance is in a trade-off relationship, so that these have difficulty to be achieved at the same time.

In contrast, in the JFET 50 according to Embodiment 1 of the present invention, the n-type buried region 4 is formed only below the n-type drain/source region 7 which is less affected by the noise, thereby reducing the on-resistance of the JFET 50 and suppressing the decrease in the noise resistance property of the analog circuit 203.

Hereinafter, a specific example of the analog circuit 203 is described which employs the JFET 50 according to Embodiment 1 of the present invention.

Figure 4:
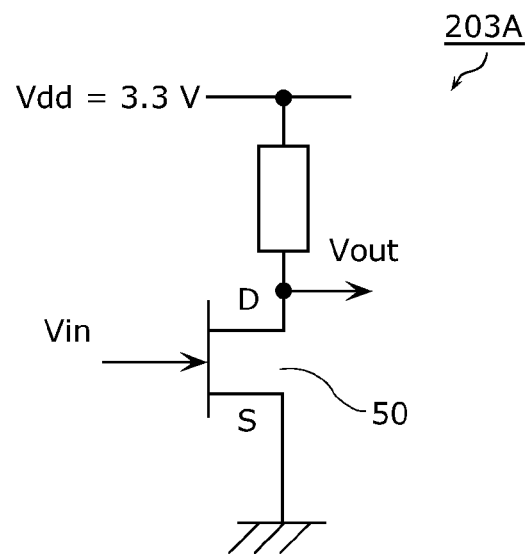
FIG. 4 is a circuit diagram which shows a source-grounded amplifier circuit according to Embodiment 1 of the present invention.

FIG. 4 is a circuit diagram showing a source-grounded amplifier circuit 203A which is an example of the analog circuit 203 according to the present invention. In the source-grounded amplifier circuit 203A shown in FIG. 4, the gate terminal (p-type gate region 6) of the JFET 50 is connected to an input terminal of the source-grounded amplifier circuit 203A, the source terminal is connected to the ground potential line, and the drain terminal located in the side where the n-type buried region 4 is not formed is connected to an output terminal of the source-grounded amplifier circuit 203A.

Figure 5:
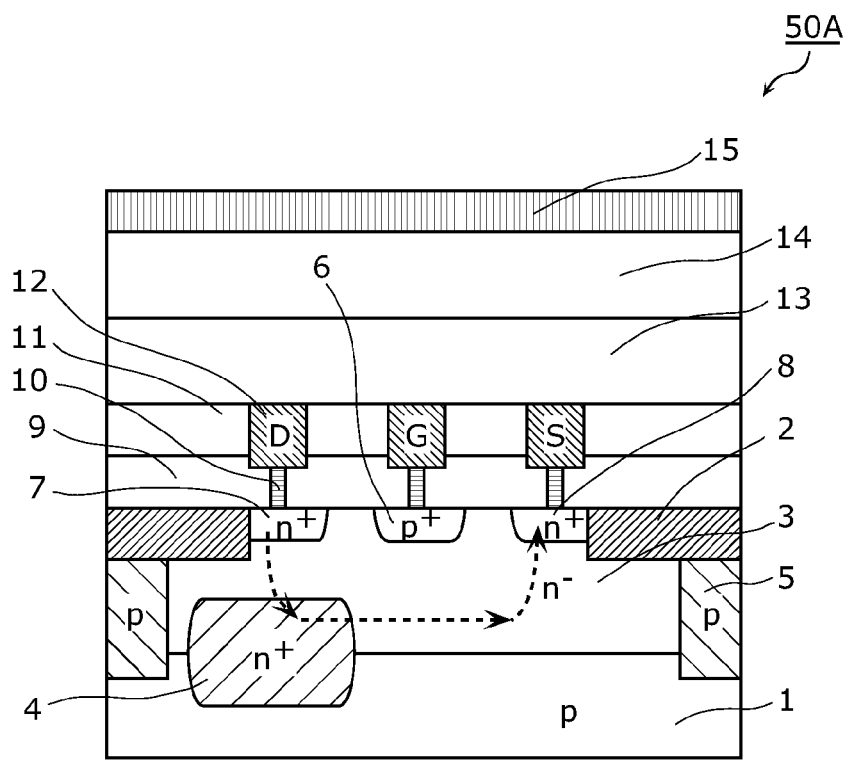
FIG. 5 is a cross sectional view which shows a modification of the JFET according to Embodiment 1 of the present invention.

Although the n-type drain/source region 7 below which the n-type buried region 4 is formed is the source region in the above description, it may be the drain region. FIG. 5 is a cross sectional view which shows a JFET 50A in which the n-type buried region 4 is formed only below the n-type drain/source region 7 which serves as the drain region.

Figure 6:
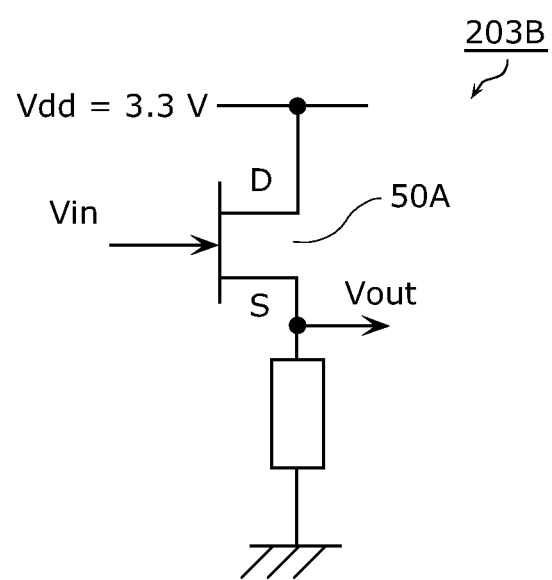
FIG. 6 is a circuit diagram which shows a source follower circuit according to Embodiment 1 of the present invention.

FIG. 6 is a circuit diagram showing a source follower circuit 203B which is an example of the analog circuit 203 employing the JFET 50A shown in FIG. 5.

In the source follower circuit 203B shown in FIG. 6, a gate terminal of the JFET 50A is connected to an input terminal of the source follower circuit 203B, a drain terminal (n-type drain/source region 7) is connected to a power-supply line, a source terminal (n-type drain/source region 8) located in the side where the n-type buried region 4 is not formed is connected to an output terminal of the source follower circuit 203B.

Figure 7:
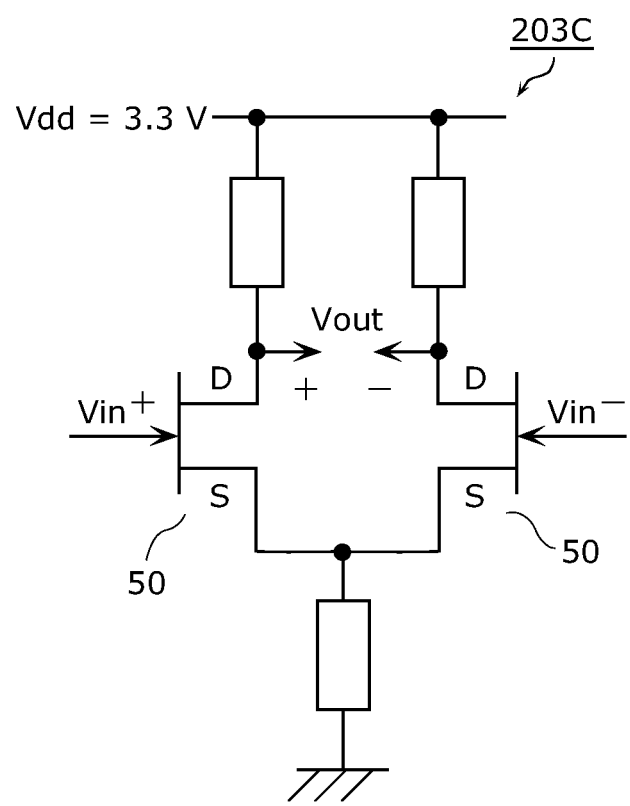
FIG. 7 is a circuit diagram which shows a differential amplifier circuit according to Embodiment 1 of the present invention.

FIG. 7 is a circuit diagram showing a differential amplifier circuit 203C which is an example of the analog circuit 203 according to the present invention.

In the differential amplifier circuit 203C shown in FIG. 7, two JFETs 50 form a differential pair. The two JFETs 50 have gate terminals which are connected to respective differential input terminals of the differential amplifier circuit 203C. In addition, the two JFETs 50 have drain terminals (the n-type drain/source region 8) which are connected to respective differential output terminals of the differential amplifier circuit 203C.

As described above, between the source terminal and the drain terminal, the n-type buried region 4 is formed in the side of a terminal corresponding to the voltage terminal or the ground potential terminal, and also the n-type buried region 4 is not formed in the side of a terminal corresponding to the output terminal, thereby achieving both of the reduction of the on-resistance and the improvement of the noise resistance property.

Although the n-type drain/source region 8 is directly connected to the output terminal of the analog circuit in the above example, it may be connected to the output terminal via another element.

In addition, an area where the n-type buried region 4 is formed is not limited to the example shown in FIG. 2.

Figure 8:
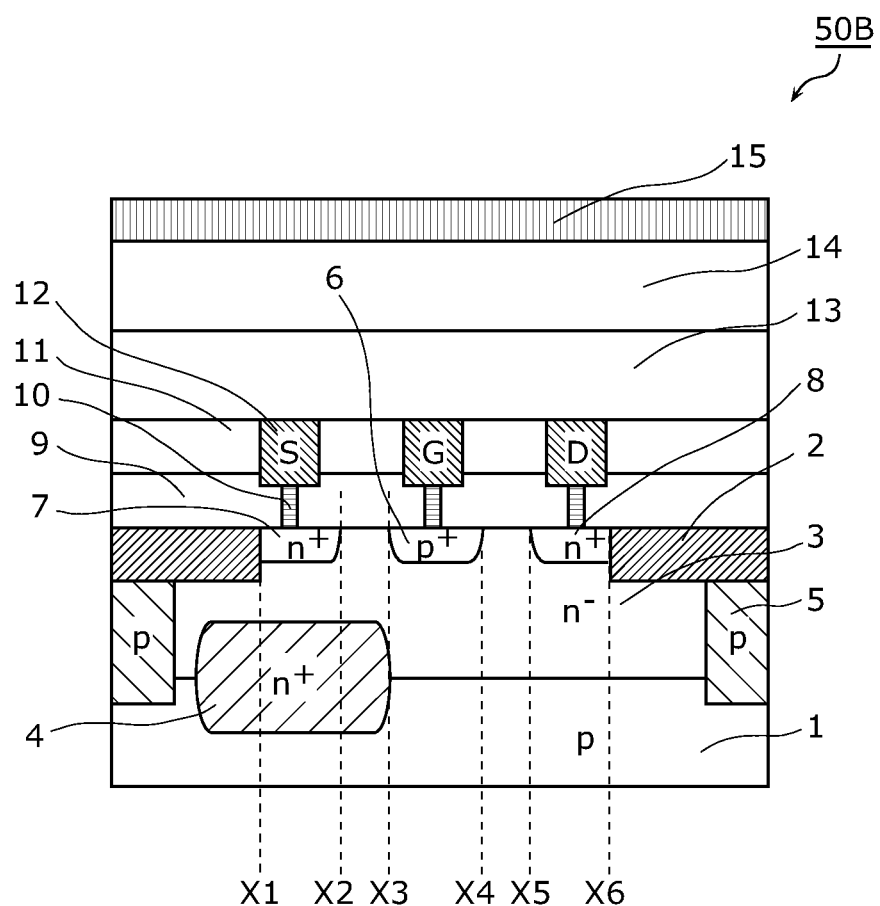
FIG. 8 is a cross sectional view which shows the modification of the JFET according to Embodiment 1 of the present invention.
Figure 9:
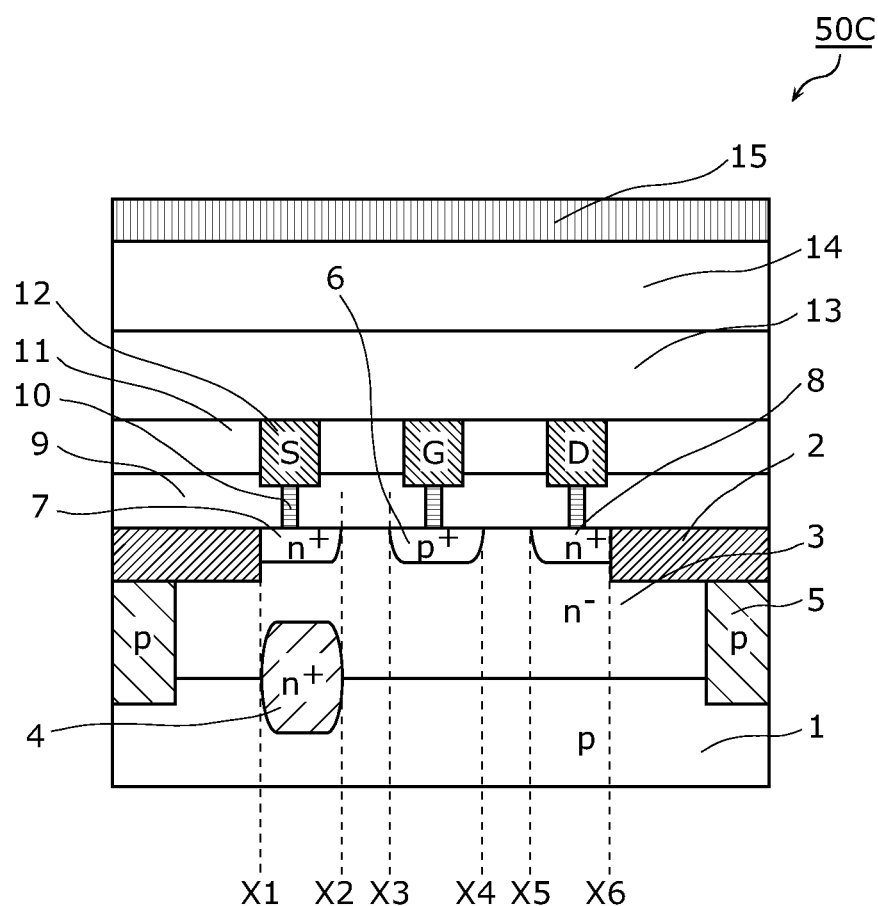
FIG. 9 is a cross sectional view which shows the modification of the JFET according to Embodiment 1 of the present invention.

FIGS. 8 and 9 are cross sectional views respectively showing JFET 50B and JFET 50C which are modifications of the JFET 50.

For example, as shown in FIG. 8, the n-type buried region 4 may be formed in an area up to a position x3 which corresponds to an end of the p-type gate region 6 in the side of the n-type drain/source region 7. Alternatively, the n-type buried region 4 may be formed only in an area segmented by a position x1 and a position x2, which is immediately below the drain/source region 7, as shown in FIG. 9.

Furthermore, the n-type buried region 4 may be formed only in a part of the area segmented by the positions x1 and x2, immediately below the drain/source region 7, or may extend to an area segmented by positions x3 and x4, which is immediately below the p-type gate region 6, or to an area segmented by the position x4 and a position x5, which corresponds to a space between the p-type gate region 6 and the n-type drain/source region 8.

In order to achieve both the reduction of the on-resistance and the suppression of decrease in the noise resistance property at the same time, however, it is preferable that the n-type buried region 4 is formed at least in the area defined by the positions x1 and x2, which is immediately below the n-type drain/source region 7, and is also not formed in an area defined by the position x5 and a position x6, which is immediately below the n-type drain/source region 8.

In order to efficiently reduce the on-resistance while the decrease in the noise resistance property is suppressed, it is preferable that the n-type buried region 4 extends to an area around the position x3 which corresponds to the end of the p-type gate region 6 in the side of the n-type drain/source region 7.

Since the n-type buried region 4 is not formed in the area defined by the positions x3 and x4, which is immediately below the p-type gate region 6, the impurity concentration in the area immediately below the p-type gate region 6 is low. This can deplete the n-type channel region 3 with a low gate voltage. In other words, a pinch-off voltage becomes low. As a result, the JFET 50 can be applied to a metal oxide semiconductor (MOS) logic circuit operated with a low voltage.

As aforementioned, the JFET according to Embodiment 1 of the present invention can reduce the influence of the external noise. It is not necessary that the analog circuit block 202 is surrounded by multiple well layers for cutting-off the external noise. Accordingly, a chip area of the semiconductor integrated circuit 200 can be reduced.

Although the example is described in which the JFET according to the present invention is used for the semiconductor integrated circuit 200 including both of an analog circuit and a digital circuit, as shown in FIG. 3, the JFET according to the present invention may be used for a semiconductor integrated circuit including only the analog circuit. Even in this case, the JFET according to the present invention can successfully reduce the influence of the noise from other analog circuits or from the outside of the semiconductor integrated circuit.

Embodiment 2

In Embodiment 2 of the present invention, a modification of the aforementioned JFET 50 is described.

Figure 10:
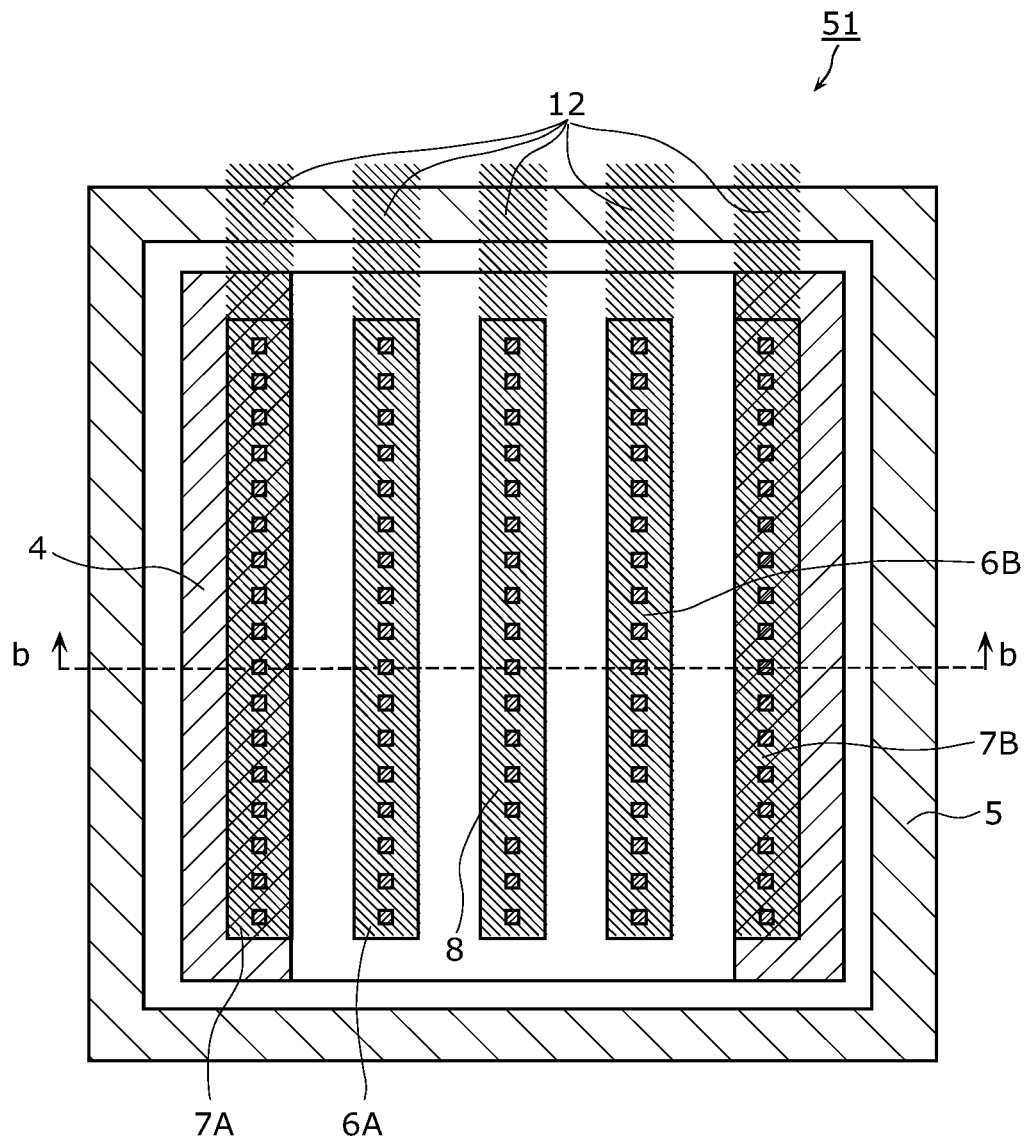
FIG. 10 is a plan view which shows a JFET according to Embodiment 2 of the present invention.
Figure 11:
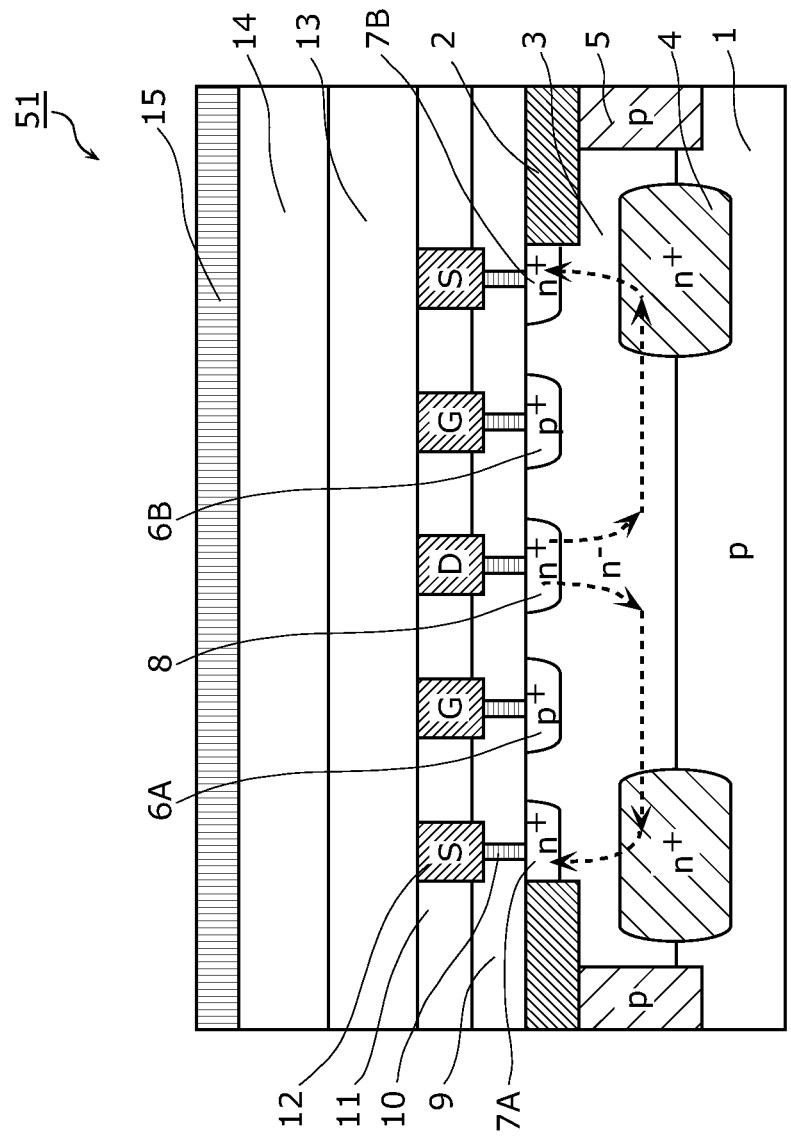
FIG. 11 is a cross sectional view which shows the JFET according to Embodiment 2 of the present invention.

FIG. 10 is a plane view which shows a JFET 51 according to Embodiment 2 of the present invention. FIG. 11 is a cross sectional view taken along a line b-b in FIG. 10. Hereinafter, only points different from Embodiment 1 are described.

The JFET 51 shown in respective FIGS. 10 and 11 includes two p-type gate regions 6A and 6B, and two drain/source regions 7A and 7B which serve as a source region of the JFET 51.

The two p-type gate regions 6A and 6B are formed in a surface of the n-type channel region 3. The two p-type gate regions 6A and 6B are formed on both sides of the n-type drain/source region 8 to sandwich it.

The drain/source regions 7A and 7B are formed in the surface of the n-type channel region 3. The drain/source region 7A is formed to sandwich, with the n-type drain/source region 8, the p-type gate region 6A. The drain/source region 7B is formed to sandwich, with the n-type drain/source region 8, the p-type gate region 6B.

In addition, though it is not shown, the p-type gate regions 6A and 6B are electrically connected via a copper (Cu) line 12. The n-type drain/source regions 7A and 7B are electrically connected via the Cu line 12.

The buried region 4 is formed only below each of the n-type drain/source regions 7A and 7B.

As described above, the JFET 51 according to Embodiment 2 of the present invention can reduce the influence of the external noise, like the JFET 50 according to Embodiment 1.

In the JFET 51, the n-type drain/source region 8 is disposed in a center part of an area where the JFET 51 is formed. This further improves the noise resistance property of the n-type drain/source region 8.

To be specific, in the configuration shown in FIG. 2 which is described in Embodiment 1, the n-type drain/source region 8 and the separation region 5 are close to each other. Accordingly, it is possible that a noise from the semiconductor substrate 1 affects on the n-type drain/source region 8 via the separation region 5 which has a low resistance value. On the other hand, in the JFET 51, the n-type drain/source region 8 is not close to the separation region 5 in the longitudinal direction of the channel (the lateral direction in FIG. 10). Accordingly, the influence by such a noise can be reduced.

It should be noted that a modification having a configuration similar to the aforementioned modification of Embodiment 1 may be applied to the WET 51.

Embodiment 3

In Embodiment 3, a modification of the aforementioned JFET 50 is described.

Figure 12:
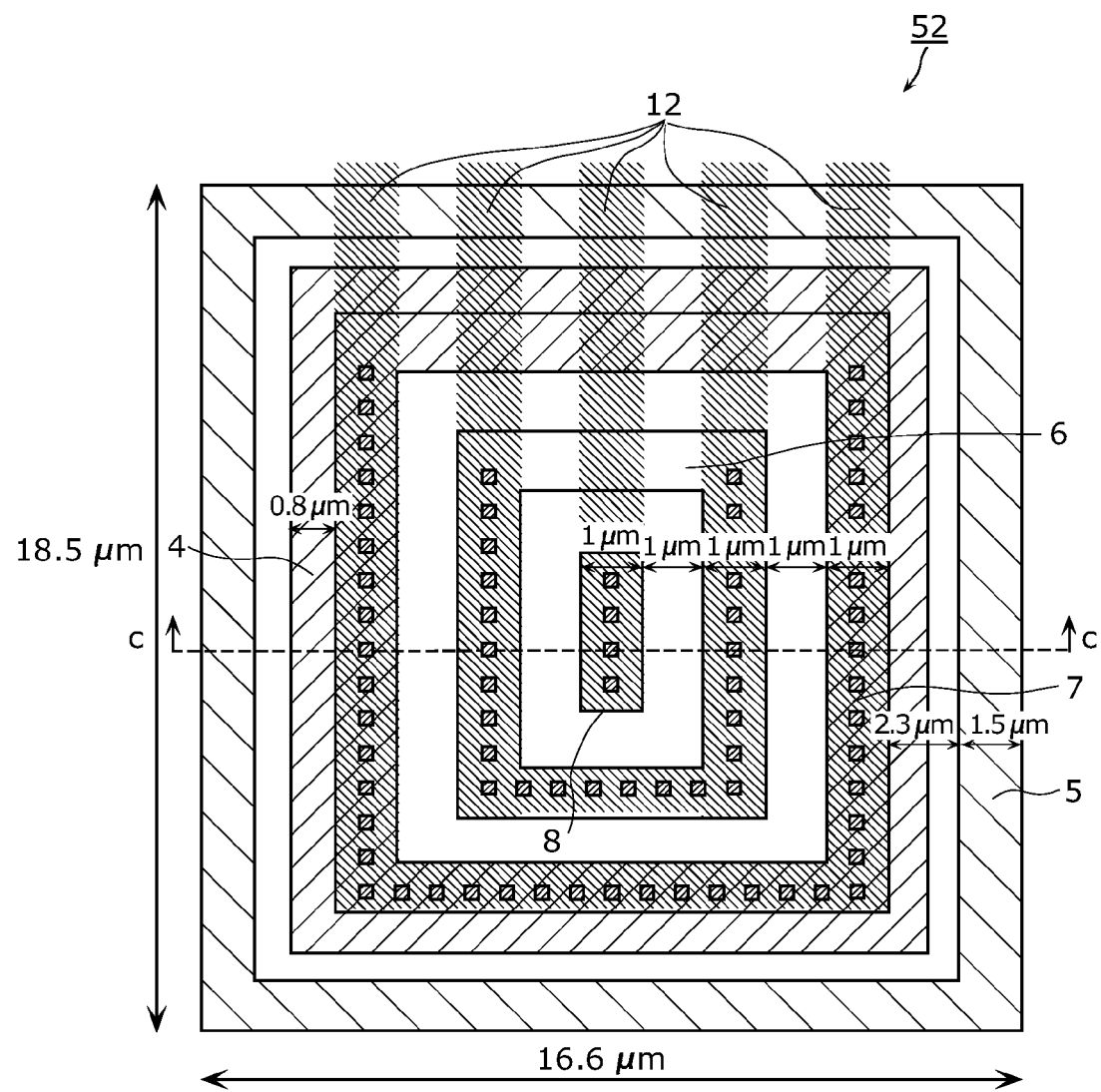
FIG. 12 is a plan view which shows a JFET according to Embodiment 3 of the present invention.
Figure 13:
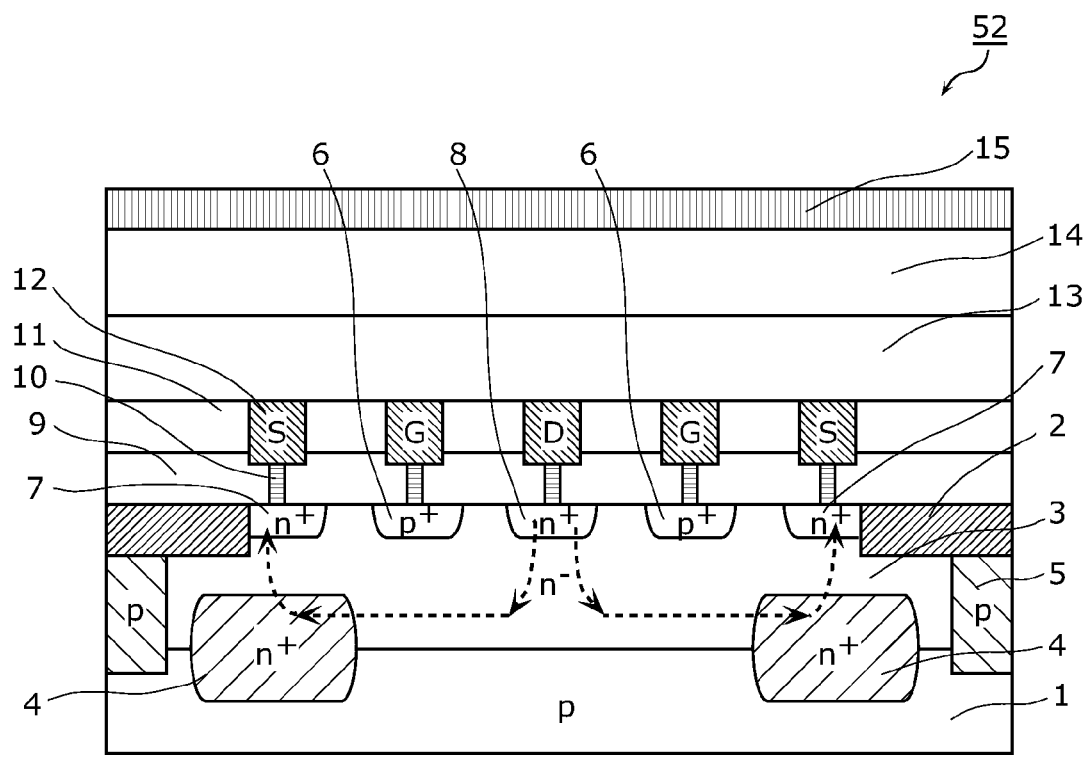
FIG. 13 is a cross sectional view which shows the JFET according to Embodiment 3 of the present invention.
Figure 14:
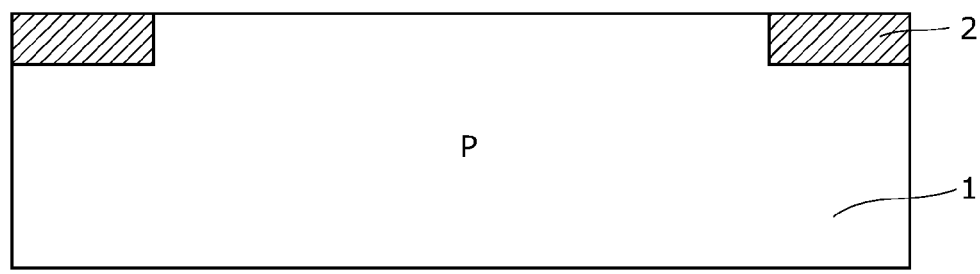
FIG. 14 is a cross sectional view which shows the JFET according to Embodiment 3 of the present invention on a manufacturing step.
Figure 15:
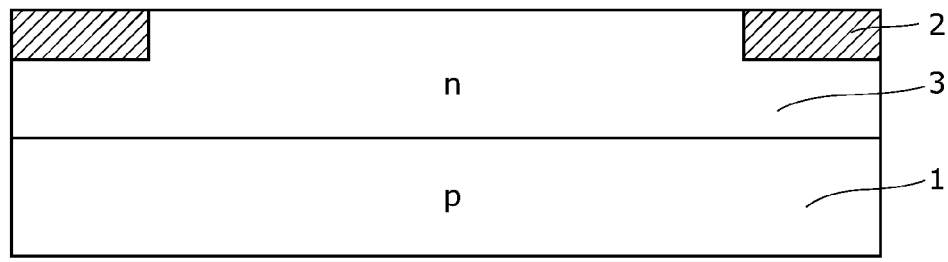
FIG. 15 is a cross sectional view which shows the JFET according to Embodiment 3 of the present invention on manufacturing step.
Figure 16:
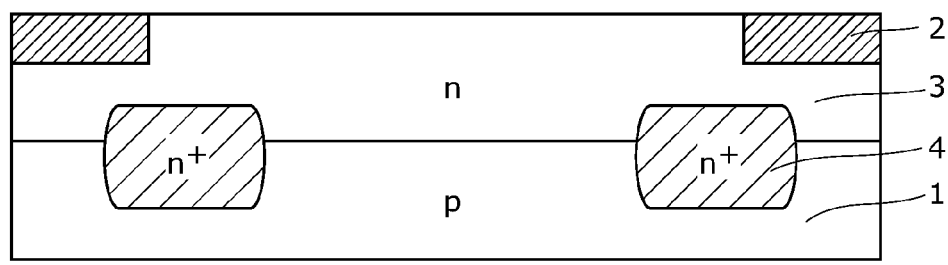
FIG. 16 is a cross sectional view which shows the JFET according to Embodiment 3 of the present invention on the manufacturing step.
Figure 17:
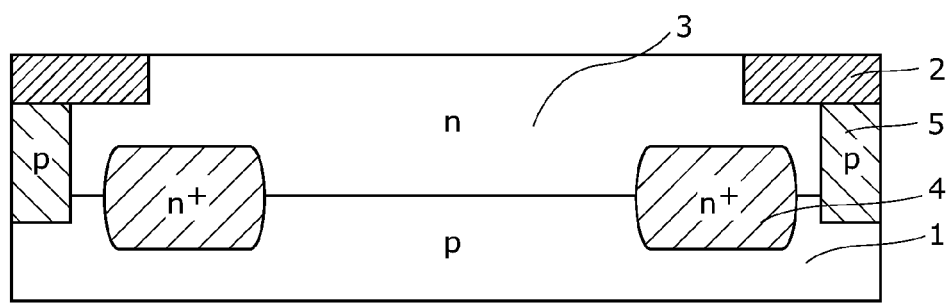
FIG. 17 is a cross sectional view which shows the JFET according to Embodiment 3 of the present invention on the manufacturing step.
Figure 18:
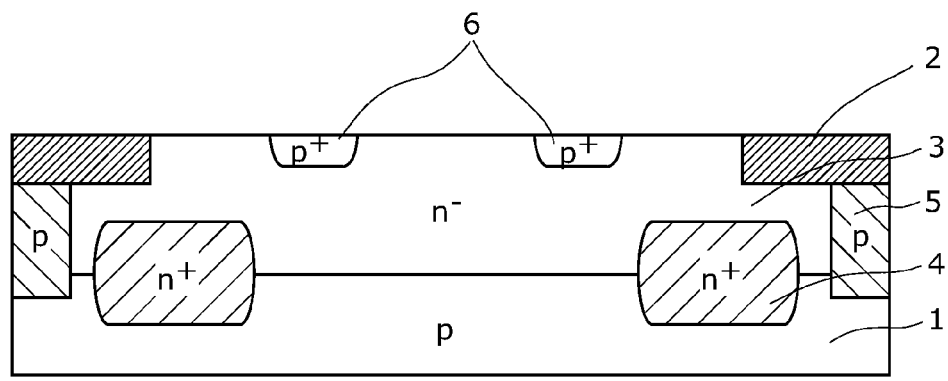
FIG. 18 is a cross sectional view which shows the JFET according to Embodiment 3 of the present invention on the manufacturing step.

FIG. 12 is a plane view which shows a JFET 52 according to Embodiment 3 of the present invention. FIG. 13 is a cross sectional view taken along a line c-c in FIG. 12. Hereinafter, only points different from Embodiment 1 are described.

In the JFET 52 shown in each of FIGS. 12 and 13, the n-type drain/source region 8, the p-type gate region 6, and the n-type drain/source region 7 are concentrically disposed in this order from the inside of the JFET 52.

In other words, the p-type gate region 6 surrounds the n-type drain/source region 8, while the n-type drain/source region 7 surrounds the p-type gate region 6.

The buried region 4 is formed only below the n-type drain/source region 7, which is the configuration similar to that shown in Embodiment 1.

As described above, the JFET 52 according to Embodiment 3 of the present invention can reduce the influence of the external noise, like the JFET 50 according to Embodiment 1.

Furthermore, in the JFET 52, the n-type drain/source region 8 is disposed in the center part of an area where the JFET 52 is formed. This further improves the noise resistance property of the n-type drain/source region 8.

To be specific, in the configuration shown in FIG. 2, which is described in Embodiment 1, the n-type drain/source region 8 and the separation region 5 are close to each other. Accordingly, it is possible that the noise from the semiconductor substrate 1 affects on the n-type drain/source region 8 via the separation region 5 which has the low resistance value. On the other hand, since the n-type drain/source region 8 is not close to the separation region 5 in the JFET 52, the influence by such a noise can be reduced.

Compared with the JFET 51 according to Embodiment 2, in the JFET 51 according to Embodiment 2, the n-type drain/source region 8 is close to the separation region 5 at an end of the n-type drain/source region 8 in the longitudinal direction thereof (the vertical direction in FIG. 10). On the other hand, in the JFET 52, the n-type drain/source region 8 is not close to the separation region 5 in any directions. Accordingly, the JFET 52 can further reduce the influence of the noise, in comparison with the JFET 51.

It should be noted that a modification having a configuration similar to that of Embodiment 1 may be applied to the JFET 52.

Hereinafter, a method for manufacturing the JFET 52 according to Embodiment 3 is described. It should be noted that manufacturing methods for JFETs 50 and 51 are similar to that for the JFET 52.

FIGS. 14 to 19 are cross sectional views each of which shows manufacturing process for the JFET 52.

[First Step (FIG. 14): Step for Forming an Insulating Film 2]

A groove for embedding the insulating film 2 is manufactured in the p-type semiconductor substrate 1 by trench etching. Then, the insulating film 2 is deposited on an entire upper surface of the p-type semiconductor substrate 1 in which the groove is manufactured. Subsequently, the surface of the p-type semiconductor substrate 1, over which the insulating film 2 is deposited is polished using chemical mechanical polishing (CMP) so as to be flattened. The ring-shaped insulating film 2 which separates the JFET52 from other devices is thus formed.

[Second Step (FIG. 15): Step for Forming the N-Type Channel Region 3]

An n-type impurity (dosage amount: 1E12 $cm^{-2}$, injection energy: 300 keV, and dosage amount: 1E12 $cm^{-2}$, injection energy: 40 keV) is selectively ion-implanted and diffused (1000° C.: 60 minutes) in an entire area where the JFET 52 is formed, so that the n-type channel region 3 is formed.

[Third Step (FIG. 16): Step for Forming the N-Type Buried Region 4]

The n-type impurity (dosage amount: 3.0E12 $cm^{-2}$, injection energy: 1200 keV) is selectively ion-implanted around an area below the insulating film 2, so that the n-type buried region 4 is formed. The n-type buried region 4 is provided below the insulating film 2 and the n-type drain/source region 7 which is formed in a subsequent step.

[Fourth Step (FIG. 17): Step for Forming the Separation Region 5]

A p-type impurity (dosage amount: 1.0E13 cm$^{-2}$, injection energy: 100 keV, and dosage amount: 1.0E13 cm$^{-2}$, injection energy: 250 keV) is selectively ion-implanted around an area below the insulating film 2, so that the separation region 5 which reaches the p-type semiconductor substrate 1 is formed.

[Fifth Step (FIG. 18): Step for Forming the P-Type Gate Region 6]

The p-type impurity (dosage amount: 3.6E15 cm$^{-2}$, injection energy: 3 keV, and dosage amount: 3.0E13 cm$^{-2}$, injection energy: 15 keV) is selectively ion-implanted in a surface of the n-type channel region 3, so that the p-type gate region 6 is formed.

[Sixth Step (FIG. 19): Step for Forming the N-Type Drain/Source Region 7 and the N-Type Drain/Source Region 8]

The n-type impurity (dosage amount: 3.0E12 cm$^{-2}$, injection energy: 20 keV, and dosage amount: 4E15 cm$^{-2}$, injection energy: 50 keV) is selectively ion-implanted on an area around each of the n-type buried regions 4 and an area between the p-type gate regions 6, so that the n-type drain/source regions 7 and 8 are respectively formed.

[Seventh Step (FIG. 13): Step for Forming Electrodes for Connection to Respective Regions]

Figure 19:
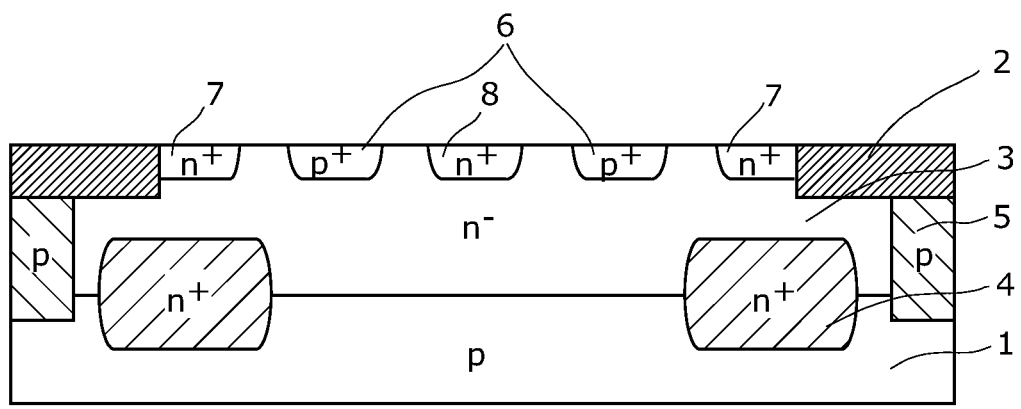
FIG. 19 is a cross sectional view which shows the JFET according to Embodiment 3 of the present invention on the manufacturing step.
Figure 20:
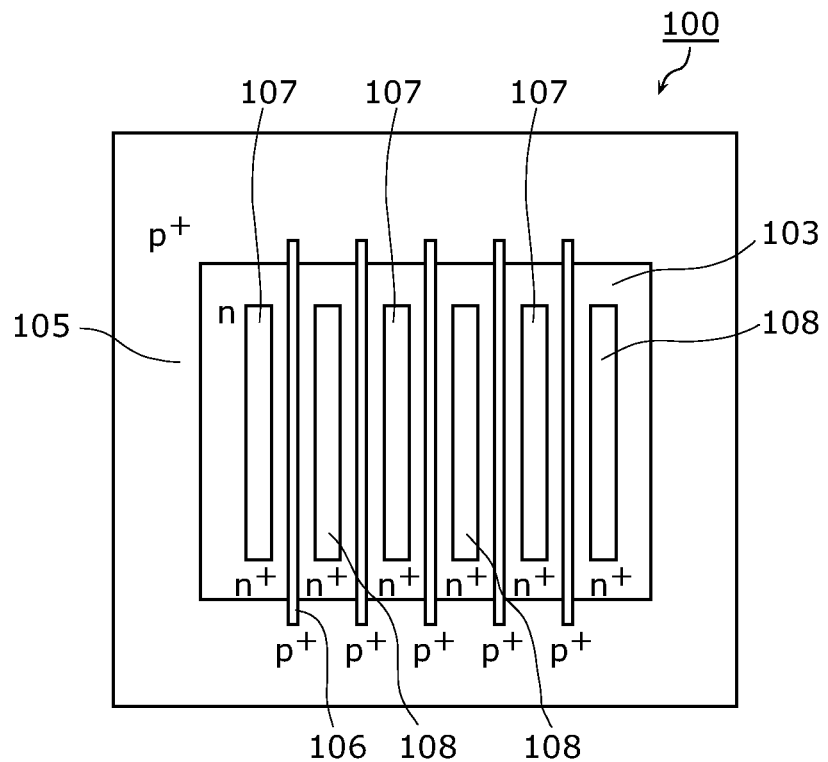
FIG. 20 is a plan view which shows a conventional JFET.
Figure 21:
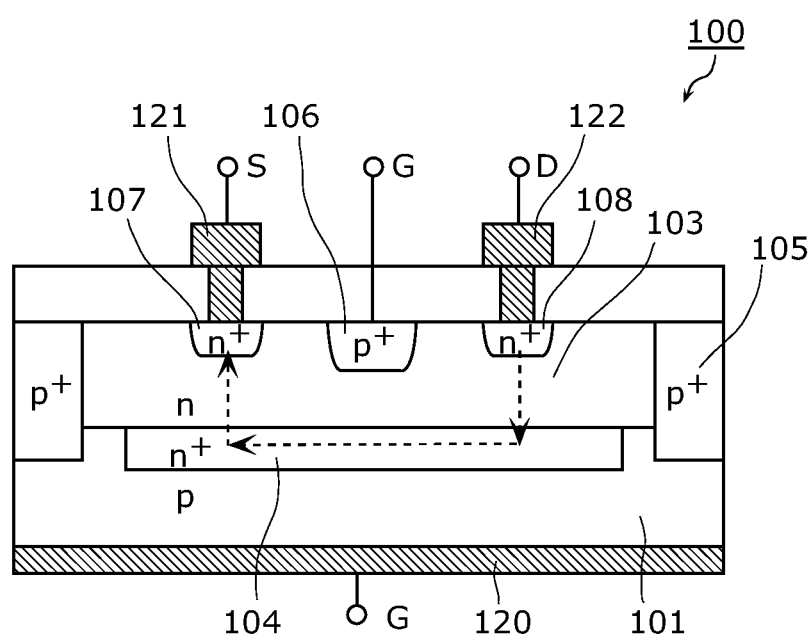
FIG. 21 is a cross sectional view which shows the conventional JFET.

An insulating film 9 is formed on an entire surface of the configuration shown in FIG. 19, and then, contact windows for the p-type gate region 6, the n-type drain/source regions 7 and 8 are opened. A tungsten 10 is embedded in each of the contact windows, and then flattening is performed using the CMP.

Next, an insulating film 11 is formed on an entire surface of the above workpiece, and then, a groove for embedding the Cu line 12 is opened. The Cu line 12 is embedded in the opened groove in the insulating film 11, and then polishing is performed using the CMP so as to be flattened.

Next, insulating films 13 and 14, and a protecting film 15 are sequentially formed over the entire surface of the workpiece.

Although the JFET, the analog circuit, and the semiconductor integrated circuit according to the embodiments of the present invention are described, the present invention is not limited to the described embodiments.

For example, though the JFET is separated using the p-type impurity region as the separation region 5, deep trench isolation (DTI) may be used. In addition, the separation region 5 may be made of insulating polysilicon and SiO$_2$, for example.

Although the n-type buried region 4 is so formed to reach the p-type semiconductor substrate 1 in the above description, it may be formed only in the n-type channel region 3.

Although corners and sides of the respective components are linearly drawn in the aforementioned plan views and the sectional views, rounded corners and rounded sides due to a manufacturing reason are included in the present invention.

At least a part of the JFET, the analog circuit, the semiconductor integrated circuit, and modifications thereof, according to the aforementioned Embodiments 1 to 3, may be combined.

All numerical references in the above are used for exemplification for specifically describing the present invention, and the present invention is not limited by the exemplified numerical references. All aforementioned materials for the respective components are used for exemplification for specifically describing the present invention, and the present invention is not limited by the exemplified materials. In addition, the conductivity types (n-type and p-type) in the respective regions are used for exemplification for specifically describing the present invention, and a similar result can be obtained by inverting the types.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present invention can be applied to a junction field effect transistor, and an analog circuit and a semiconductor integrated circuit which use the junction field effect transistor.

The invention claimed is:

1. A junction field effect transistor comprising:
   a semiconductor substrate having a first conductivity type;
   a channel region having a second conductivity type different from the first conductivity type, and being formed in a surface of the semiconductor substrate;
   a first buried region having the second conductivity type, being formed within the channel region, and having an impurity concentration higher than the channel region;
   a first gate region having the first conductivity type, and being formed in a surface of the channel region; and
   a first source region and a drain region both having the second conductivity type, which are formed each on an opposite side of the first gate region in the surface of the channel region,
   wherein the first buried region is formed below the first source region and apart from the first source region, and no buried region is formed below the drain region when viewed in plan, and
   the first buried region is not formed below the first gate region.

2. The junction field effect transistor according to claim 1, further comprising:
   a second gate region formed in the surface of the channel region so that the drain region is located between the second gate region and the first gate region;
   a second source region formed in the surface of the channel region so that the second gate region is located between the second source region and the drain region;
   a first line electrically connecting the first gate region to the second gate region;
   a second line electrically connecting the first source region to the second source region; and
   a second buried region having the second conductivity type, being formed below the second source region and apart from the second source region within the channel region, and having the impurity concentration higher than the channel region.

3. The junction field effect transistor according to claim 1, wherein the first gate region surrounds the drain region, and the first source region surrounds the first gate region.

4. An analog circuit comprising:
   a first junction field effect transistor which is the junction field effect transistor according to claim 1;
   an output terminal;
   a power-supply terminal; and
   a ground potential terminal,
   wherein the first junction field effect transistor has the first source region connected to a side of the power-supply terminal or a side of the ground potential terminal, and the first junction field effect transistor has the drain region connected to a side of the output terminal.

5. The analog circuit according to claim 4, wherein the first junction field effect transistor has the drain region connected directly to the output terminal.

6. The analog circuit according to claim 4, wherein the first junction field effect transistor has the first source region connected directly to the power-supply terminal or the ground potential terminal.

7. The analog circuit according to claim 6,
wherein the analog circuit is a source-grounded amplifier circuit which has an input terminal, and
the first junction field effect transistor has the first gate region connected to the input terminal.

8. The analog circuit according to claim 5,
wherein the analog circuit is a differential amplifier circuit which has two differential input terminals;
the analog circuit includes a second junction field effect transistor which is the junction field effect transistor according to claim 1;
the first and second junction field effect transistors serve as a differential pair;
the first junction field effect transistor has the first gate region connected to one of the differential input terminals; and
the second junction field effect transistor has the first gate region connected to the other of the differential input terminals.

* * * * *